United States Patent
Finlay et al.

(10) Patent No.: US 10,109,046 B2
(45) Date of Patent: Oct. 23, 2018

(54) METHODS OF DETECTING FAULTS IN REAL-TIME FOR SEMICONDUCTOR WAFERS

(71) Applicant: GLOBALFOUNDRIES Inc., Grand Cayman (KY)

(72) Inventors: Robert Boyd Finlay, Ballston Lake, NY (US); Yunsheng Song, Poughkeepsie, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 176 days.

(21) Appl. No.: 15/213,665

(22) Filed: Jul. 19, 2016

(65) Prior Publication Data

US 2018/0025483 A1    Jan. 25, 2018

(51) Int. Cl.
| | |
|---|---|
| *G06T 7/00* | (2017.01) |
| *G06T 7/60* | (2017.01) |
| *G06K 9/52* | (2006.01) |
| *G06K 9/62* | (2006.01) |
| *G06T 7/20* | (2017.01) |

(52) U.S. Cl.
CPC ............ *G06T 7/0004* (2013.01); *G06K 9/52* (2013.01); *G06K 9/6201* (2013.01); *G06T 7/2033* (2013.01); *G06T 7/60* (2013.01); *G06T 2207/30148* (2013.01)

(58) Field of Classification Search
CPC ....... G06T 7/0004; G06T 2/2033; G06T 2/76; G06T 2207/30148; G06K 9/52; G06K 9/6201
See application file for complete search history.

(56) References Cited

U.S. PATENT DOCUMENTS

| | | | |
|---|---|---|---|
| 5,420,441 A | 5/1995 | Newman et al. | |
| 8,582,864 B2 | 11/2013 | Maeda et al. | |
| 2005/0037272 A1* | 2/2005 | Tanaka | G03F 7/70991 430/30 |
| 2011/0188733 A1* | 8/2011 | Bardos | G01N 21/6489 382/149 |
| 2014/0184671 A1* | 7/2014 | Lee | G09G 3/006 345/697 |

FOREIGN PATENT DOCUMENTS

EP        0165734 A2      12/1985

* cited by examiner

*Primary Examiner* — Michael E Teitelbaum
(74) *Attorney, Agent, or Firm* — Heslin Rothenberg Farley & Mesiti P.C.; Nathan B. Davis

(57) ABSTRACT

Systems for and methods of detecting faults in semiconductor wafers are provided. One method includes, for instance: monitoring, with at least one sensor, a recipe for manufacturing a semiconductor wafer; tracking, with a fault detection system, a set of steps for the recipe; determining a start of a step; sensing a set of data related to at least one parameter of the step; generating, by an imaging system, an image of the set of data; displaying, on a display, the image of the set of data; calculating, by the fault detection system, a pixel area ratio from the image of the set of data; determining if a fault exists in the wafer based upon the pixel area ratio; and displaying, on the display, an indication of the fault during real-time and at an end of the step.

20 Claims, 5 Drawing Sheets

METHODS OF DETECTING FAULTS IN REAL-TIME FOR SEMICONDUCTOR WAFERS

FIELD OF THE INVENTION

The present invention relates to methods of detecting faults in real-time and post-process analysis methods for semiconductor wafers, and more particularly, to methods utilizing chart pixel ratios across recipe transitions.

BACKGROUND OF THE INVENTION

With the continually increasing demand for smaller circuit structures and faster device performance, semiconductor wafer manufacturing has grown more complicated. With the increased complexity, each 'recipe' requires more and more processes, or 'transitions,' to manufacture a wafer. With each transition, the possibility of a fault from the processing is introduced.

Typically, some data is collected before, during, and/or after some or all transitions. However, this approach is costly, time consuming, and frequently requires 40 or more engineers present to monitor the transitions, as well as the testing and analysis. Additionally, the data is not always accurate due to trimming and windowing of trace data in small time frames, using sequential statistics math to make fault detection classification (FDC) models.

It is desirable to develop simple graphical recipe transition representation methods of real-time fault detection and post-process analysis methods for semiconductor wafer manufacturing to monitor for known unwanted or new baseline performance changes.

BRIEF SUMMARY

The shortcomings of the prior art are overcome and additional advantages are provided through the provisions, in one aspect, a method that includes, for instance: monitoring, with at least one sensor, a recipe for manufacturing a semiconductor wafer; tracking, with a fault detection system, a set of steps for the recipe; determining, by the fault detection system, a start of a step; sensing, by the at least one sensor, a set of data related to at least one parameter of the step; generating, by an imaging system, an image of the set of data; displaying, on a display, the image of the set of data; calculating, by the fault detection system, a pixel area ratio from the image of the set of data; determining if a fault exists in the wafer, by the fault detection system, based upon the pixel area ratio; and displaying, on the display, an indication of the fault at an end of the step.

In another aspect, system for detecting faults in a wafer utilizing a method, the method including, for instance: monitoring, with at least one sensor, a recipe for manufacturing a semiconductor wafer; tracking, with a fault detection system, a set of steps for the recipe; determining, by the fault detection system, a start of a step; sensing, by the at least one sensor, a set of data related to at least one parameter of the step; generating, by an imaging system, an image of the set of data; displaying, on a display, the image of the set of data; calculating, by the fault detection system, a pixel area ratio from the image of the set of data; determining if a fault exists in the wafer, by the fault detection system, based upon the pixel area ratio; and displaying, on the display, an indication of the fault at an end of the step.

BRIEF DESCRIPTION OF THE SEVERAL VIEWS OF THE DRAWINGS

One or more aspects of the present invention are particularly pointed out and distinctly claimed as examples in the claims at the conclusion of the specification. The foregoing and other objects, features, and advantages of the invention are apparent from the following detailed description taken in conjunction with the accompanying drawings in which:

DETAILED DESCRIPTION

Aspects of the present invention and certain features, advantages, and details thereof, are explained more fully below with reference to the non-limiting embodiments illustrated in the accompanying drawings. Descriptions of well-known materials, fabrication tools, processing techniques, etc., are omitted so as to not unnecessarily obscure the invention in detail. It should be understood, however, that the detailed description and the specific examples, while indicating embodiments of the invention, are given by way of illustration only, and are not by way of limitation. Various substitutions, modifications, additions and/or arrangements within the spirit and/or scope of the underlying inventive concepts will be apparent to those skilled in the art from this disclosure. Note also that reference is made below to the drawings, which are not drawn to scale for ease of understanding, wherein the same reference numbers used throughout different figures designate the same or similar components.

Generally stated, disclosed herein are certain systems and methods of detecting faults in a semiconductor wafer. Advantageously, the detection methods disclosed herein provide for real-time detection and post processing analysis of the wafer manufacturing process.

Figure 1:
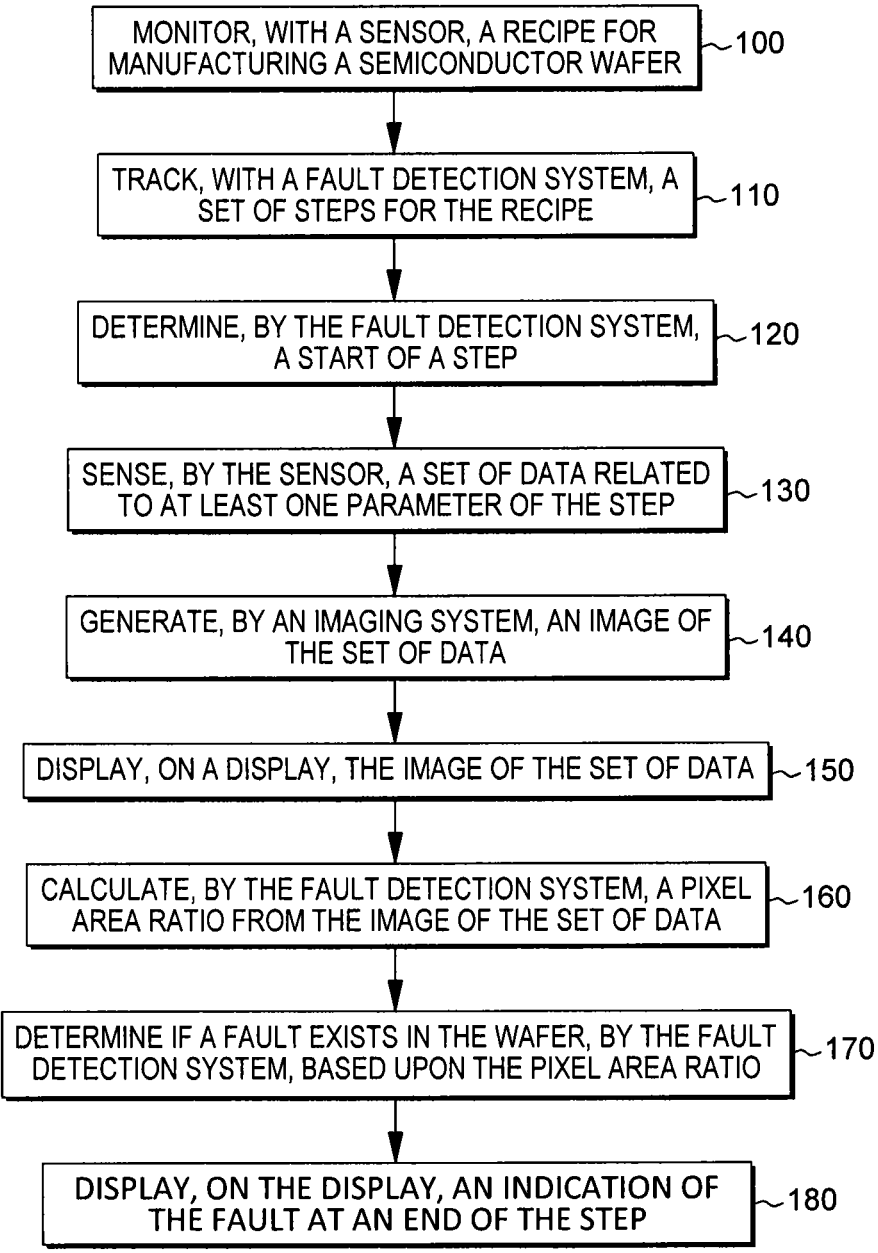
FIG. 1 depicts a flow chart describing one embodiment of a method of detecting faults in a semiconductor wafer, in accordance with one or more aspects of the present invention.

In one aspect, in one embodiment, as shown in FIG. 1, an integrated circuit device formation process in accordance with one or more aspects of the present invention may include, for instance: monitoring, with a sensor, a recipe for manufacturing a semiconductor wafer 100; tracking, with a fault detection system, a set of steps for the recipe 110; determining, by the fault detection system, a start of a step 120; sensing, by the sensor, a set of data related to at least one parameter of the step 130; generating, by an imaging system, an image of the set of data 140; displaying, on a display, the image of the set of data 150; calculating, by the fault detection system, a pixel area ratio from the image of the set of data 160; determining if a fault exists in the wafer, by the fault detection system, based upon the pixel area ratio 170; and displaying, on the display, an indication of the fault at an end of the step 180.

Figure 2:
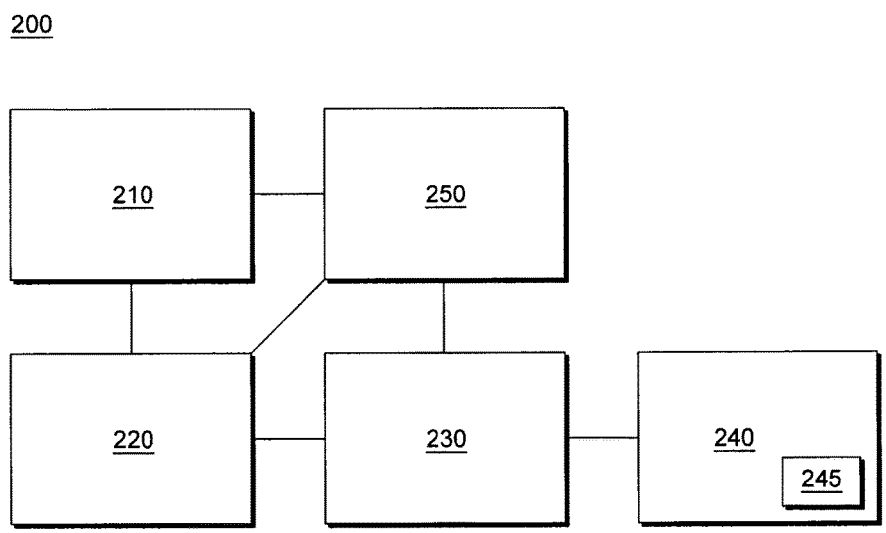
FIG. 2 depicts a system for detecting faults in a semiconductor wafer, in accordance with one or more aspects of the present invention.

FIG. 2 depicts, by way of example only, one system for detecting faults in a semiconductor wafer, in accordance with one or more aspects of the present invention. Note that these figures are not drawn to scale in order to facilitate understanding of the invention, and that the same reference numerals used throughout different figures designate the same or similar elements.

FIG. 2 shows a system 200 for detecting faults in a wafer utilizing the methods disclose herein. For instance, system 200 includes a sensor 210. While shown as a single sensor 210, it should be understood that any number of sensors or tools may be included. These can include any sensors, tools, or built in sensors in other systems in communication with system 200. For instance, in manufacturing a semiconductor wafer, sensor 210 can be any sensor used with or associated with a lithography scanner, multiple gas lines, an exhaust system, chambers and transfer stations, forelines, wet chemical systems, chemical mechanical polishing (CMP) systems, generators, plasma exposure systems, electrostatic chucks, robots, and any other systems which may be used in the processing and/or manufacturing of semiconductor wafers.

As depicted in FIG. 2, the sensor 210 monitors a recipe for manufacturing a semiconductor wafer. The recipe is essentially a blueprint for manufacturing, including any and all steps that may be included to process a wafer. The recipe may include, for instance, a reactive ion etch (RIE) recipe. A set of steps of the recipe frequently include approximately 20 steps, but depending upon the complexity of the wafer, may include more or less steps than this. The sensor 210, whether one or many sensors, may monitor the whole of the recipe, including each step.

As depicted in FIG. 2, a fault detection system 220 tracks the set of steps for the recipe. The fault detection system 220 may be embodied on any transitory storage device and includes any hardware necessary to function. The recipe can be inputted into the fault detection system 220, such that it can determine the start of a step and instruct sensor 210 to sense a set of data related to at least one parameter of the step. The sensor can collect the data and the fault detection system 210 can create a baseline of the set of data. The sensing can include real-time sensing, where a continuous set of data is collected throughout the entirety of the transition step.

The at least one parameter may be a single parameter, or a plurality of parameters. The parameters may include any condition or variable related to a step, or transition. For instance, each tool or chamber used can have a variety of observable parameters. In a typical wafer manufacturing process, at least 1200 tools can be used and upwards of 3,000 chambers, resulting in at least 1.5 million parameters, sometimes called traces, which may be sensed and recorded in embodiments of the present invention, and thus the following examples are not intended to be limiting, but rather to illustrate the types of parameters measured.

In some embodiments, a litho scanner may be used. This can include in excess of 200 traces, including but not limited to multiple traces related to the wafer table positioning, multiple traces related to an alignment laser, multiple traces for a temperature, often across multiple locations, the check position, and the humidity level.

In some embodiments, gas lines may include parameters relating to line pressure of the gas lines, mass flow rates (MFCs), valve positions, valve angles, valve pressure, concentrations of the various gasses used in the gas lines, and parameters relating to gas injectors. Where an exhaust system is used, parameters may include airflow rates and static pressure of the exhaust system.

In some embodiments, chambers and transfer stations can include parameters including leak rates, door valve speeds, pyrometer readings, thermocouples, and laser power intensities. Use of forelines can include parameters such as vacuum pressure, leak rates, the pump down and the pump up speeds, pump vibrations, and a heater jacket temperature.

In some embodiments, wafer processing will include wet chemical processes, for instance wet chemical etching. In these embodiments, further parameters may include, but are not limited to, a slurry flow rate, slurry concentrations, various temperature traces across multiple areas, a photoresist flow rate, a photoresist dispense pressure, a photoresist suckback rate, a photoresist pump filter delta pressure, a flow rate for a developer, a line temperature for the developer, flowrate and pressure traces for deionized (DI) water, and day tank circulation rates. Additionally, chemical mechanical polishing (CMP) is commonly used during wafer processing. Traces related to CMP can include a downforce, the head pressure, torque of the brush, platen vibration, and the downforce of a conditioner.

In some embodiments, generators are used, and parameters can include a DC bias and voltage variations for micro-arc detection. Where plasma is utilized, parameters can include the radio frequency (RF) matching and impedance traces. Spin-on tools may have tracked the chuck spin revolutions per minute (RPM) or speed, which may be extrapolated from the RPM, chuck acceleration, chuck temperature, and vacuum of the chuck. With the use of electrostatic chucks, parameters can further include, for instance, traces of the current, the voltage, polarity, clamping speeds, and the backside helium flow.

Figure 3:
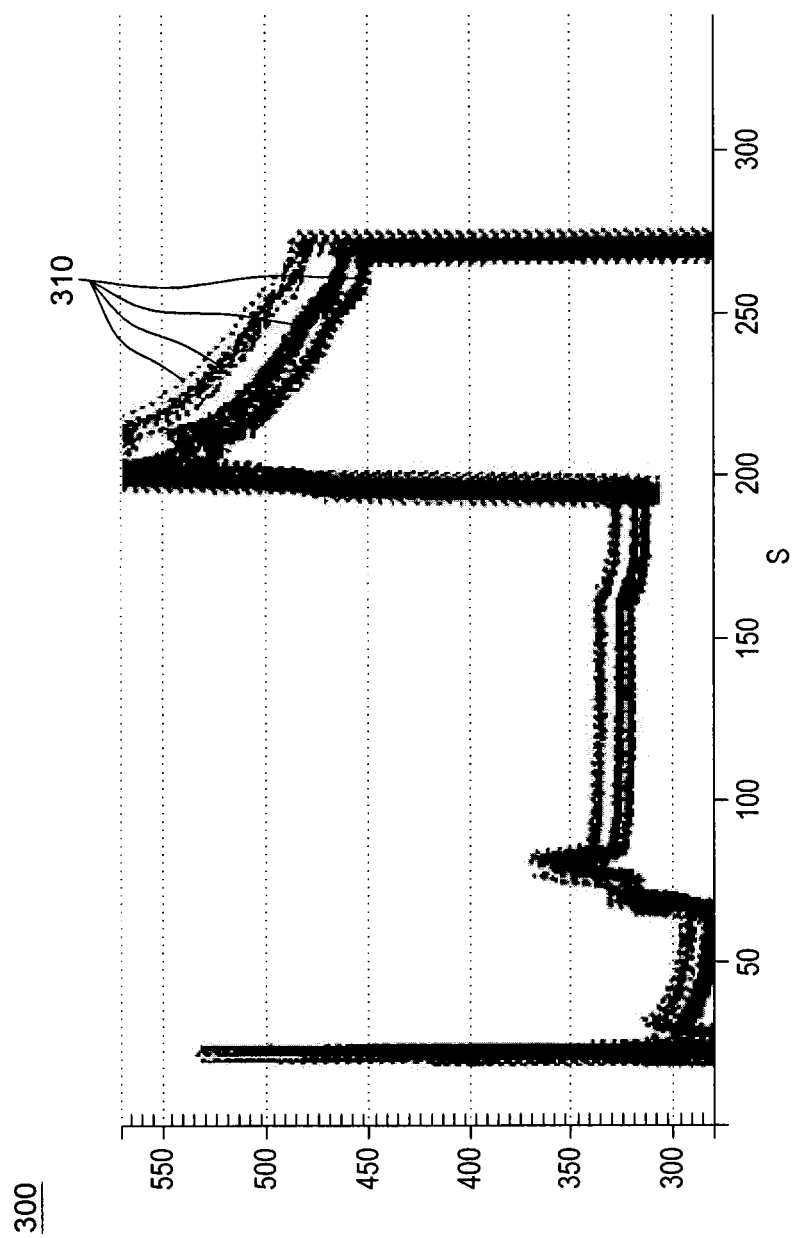
FIG. 3 depicts an example set of base lines for a parameter, in accordance with one or more aspects of the present invention.

Finally, in some embodiments, robots are utilized and include parameters such as vibrations, vacuum, acceleration, and the X, Y, and Z positions of the robot or moving parts of a robot. It should be understood that many other parameters or traces can be sensed, and any and all of them should be included as a part of this disclosure, as well as the tools or sensors necessary to sense these parameters.

Where a single parameter is sensed, the set of data can be used to generate an image of the set of data by an imaging system 230, FIG. 2. However, in some embodiments, any number of parameters may be sensed. For each parameter sensed, multiple base lines from multiple wafers can be seen in FIG. 3, which shows results 300 of the observed base lines 310 of a valve pressure for a plurality of wafers. The base lines represents acceptable data sets, setting the standard for the expected results. Only one of these lines would exist for a single wafer. However, each parameter would have a similar base line, which could all then be compiled into a single image depicting every base line, and thus every measured parameter, for a single wafer in a single image.

Figure 4:
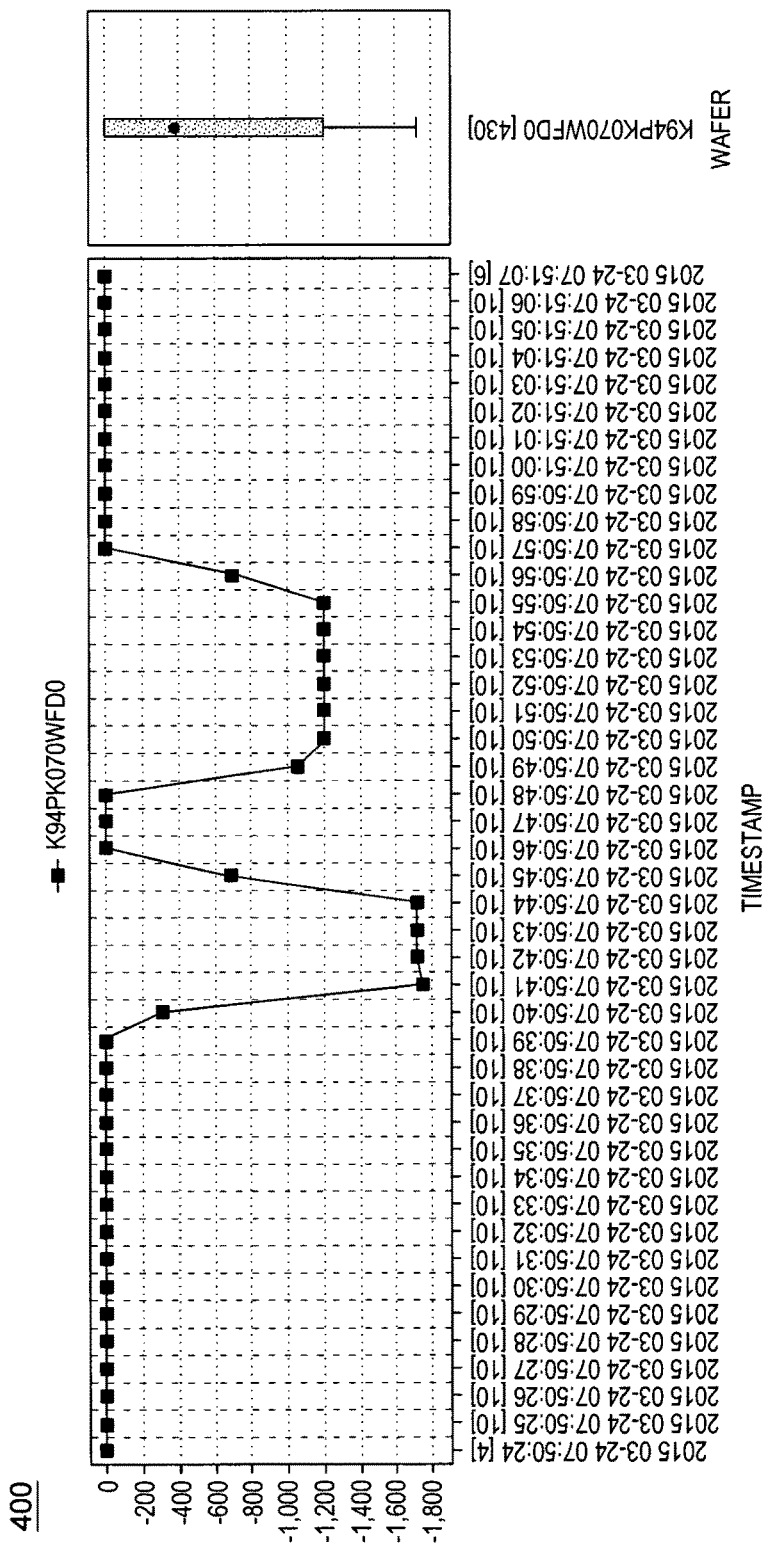
FIG. 4 depicts an image of the set of data, in accordance with one or more aspects of the present invention.

As depicted in FIG. 4, following the sensing, an image 400 is generated by the imaging system 230 (FIG. 2), which depicts one or all of the base lines in a single image. This image can then be displayed on a display 240 (FIG. 2), which can include display drivers 245. It should be understood that this image is only a part of the overall image that can be generated. For instance, this image depicts only a couple of transitions rather than all of the transitions typically associated with wafer formation. In this embodiment, each change in the line depicts a transition step of the overall recipe.

Figure 5:
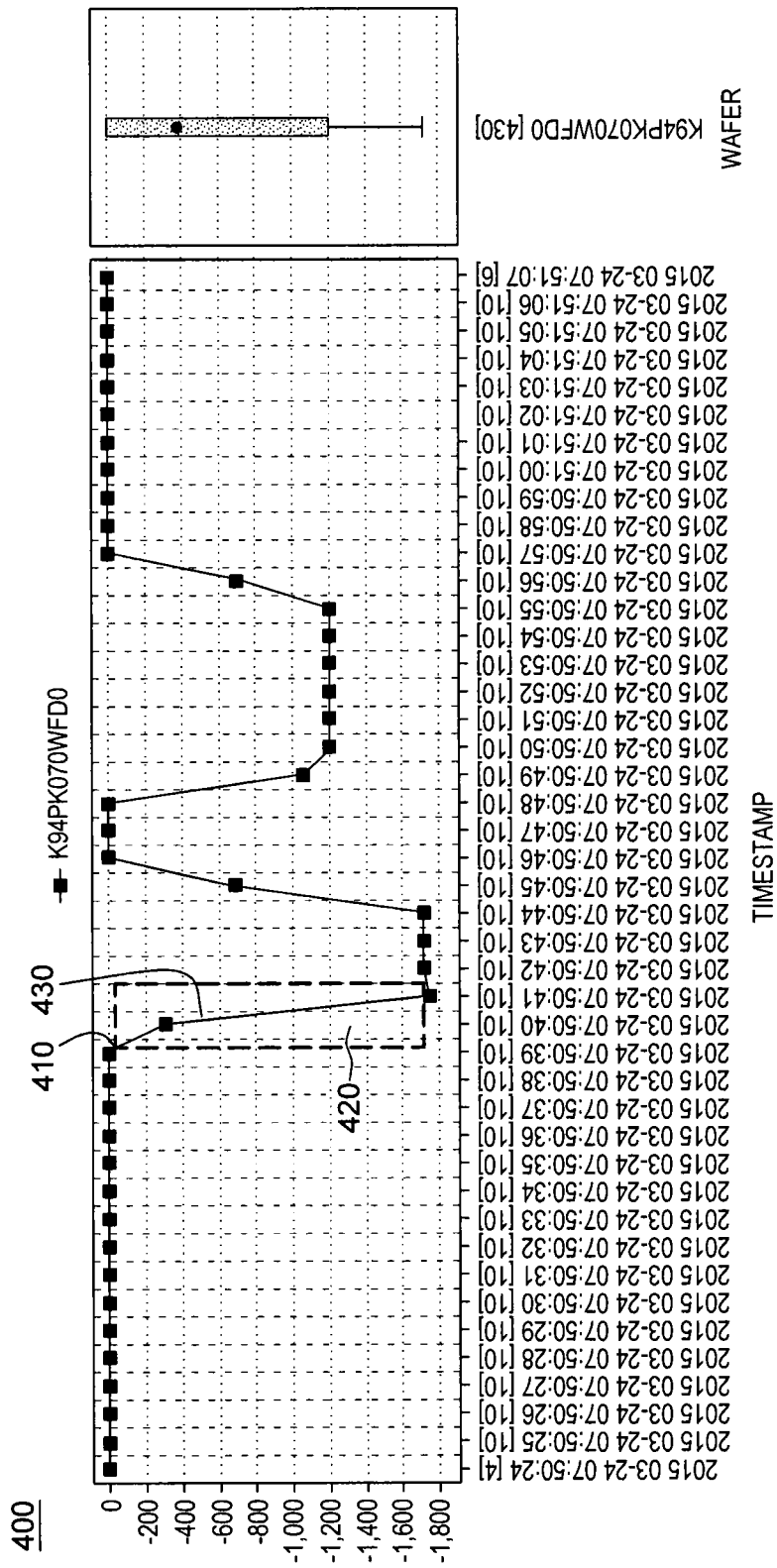
FIG. 5 depicts the image of the set of data of FIG. 4 while calculating a pixel area ratio, in accordance with one or more aspects of the present invention.

As depicted in FIG. 5, from the image of the set of data, the fault detection system 220 (FIG. 2) can calculate a pixel area ratio for each transition, which again can be done in real-time. For instance, area 410 illustrates the image as it represents a single transition based on the timestamp of the process. The pixel area ratio can be calculated, for instance, by determining a pre-pixel area 420, which include the pre-transition pixels, and a post-pixel area 420, the pixels after the transition. These can be compared, for instance by dividing the pre-pixel area 420 by the post-pixel area 230 to calculate the pixel area ratio for the duration of the step.

Following the calculation of the pixel area ratio, or in some embodiments, concurrently while calculating the pixel area ratio in real-time, the fault detection system 220 may determine if a fault exists in the wafer based upon the pixel area ratio. For instance, the fault detection system 220 can compare the pixel area ratio of the wafer at the transition to a set of historical pixel area ratio results for similar transitions and/or similar wafers. The set of historical pixel area ratio results may be stored, for instance, in a database such as database 250 (FIG. 2). That is, a "preferred standard" may exist, such as a set of historical data for previously successfully made wafers, and the current transitions can be observed to generate an image and compare the current pixel area ratio to an average of the previously successful transitions.

If the pixel area ratio does not match the expected value, the fault detection system 230 communicates with the display 240 to display an indication of the fault detected on the wafer either immediately, or at the end of the current step. It is to be understood that the indication can occur following the step or that it may be displayed at any time in the real-time analysis of the step as soon as the value deviates from an expected value. If the pixel area ratio does not indicate a fault, the data may be added to the historical pixel area ratio results, for instance, in database 250 (FIG. 2).

Since the fault detection system 220 uses the image generated of the set of data, this method is scalable with the display 240. That is, the pixel area ratio is able to be more and more accurate with the increase of the pixel density of the display 240. For instance, the display can include an ultra-high definition (UHD) display, which may be capable of running at 4K resolution. This would allow for a better image than a standard high definition (HD) display, and thus a more accurate fault detection. The granularity of the method, according to aspects of the invention, is dependent upon the pixel granularity of the display 240, as determined by the pixels per inch (PPI) of the image resolution on a given display. With increasing definition displays, the image may be zoomed in on as well, allowing for determining the pixel area ratio from an enlarged portion of the image that focuses, for instance, only on the pixel areas of the current transition occurring, which may be detected by a change in the pixels over a certain threshold.

As a result, the determination of the existence of a fault according to certain embodiments scales with the display and is tied to a comparison of trace data acquired from the sensor 210 on a display, and not based on sequential mathematical statistics as with previous FDC models. Also, as an additional advantage, this allows for analysis independent of recipe steps and context data, eliminating the need for so many engineers observing every transition of a recipe and allowing for the image to determine any faults in a wafer.

In further embodiments, the stored data from the images, as disclosed above, for each wafer processed or only for good wafers, can be stored in database 250 (FIG. 2). This historical data can be used for post processing analysis of recipe steps. For instance, if a fault is being found in wafers after manufacture, the data can be analyzed in order to determine a step which may be contributing to a historical fault or to find a flaw missed previously. The historical pixel area ratio results can include every wafer ever processed through the system, and thus can be used to analyze every transition as well as be used as a comparison for similar processes until new data is acquired for new recipes.

According to embodiments, it should be understood that detecting a fault in a wafer is accomplished in real-time using constant data acquisition rather than averaging minimum and maximum values before and/or after transitions. The generated simple image allows for analysis based on the image rather than requiring offline statistical analysis by teams of engineers. Instead, data is generated which is transformed into a new image which allows for pixel comparisons to a 'golden standard' image. Thus, faults are more accurately found during a manufacturing process and without requiring further processing to a wafer with a fault on it.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include" (and any form of include, such as "includes" and "including"), and "contain" (and any form contain, such as "contains" and "containing") are open-ended linking verbs. As a result, a method or device that "comprises", "has", "includes" or "contains" one or more steps or elements possesses those one or more steps or elements, but is not limited to possessing only those one or more steps or elements. Likewise, a step of a method or an element of a device that "comprises", "has", "includes" or "contains" one or more features possesses those one or more features, but is not limited to possessing only those one or more features. Furthermore, a device or structure that is configured in a certain way is configured in at least that way, but may also be configured in ways that are not listed.

The corresponding structures, materials, acts, and equivalents of all means or step plus function elements in the claims below, if any, are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of one or more aspects of the invention and the practical application, and to enable others of ordinary skill in the art to understand one or more aspects of the invention for various embodiments with various modifications as are suited to the particular use contemplated.

What is claimed is:

1. A method of detecting faults in a semiconductor wafer, the method comprising:

monitoring, with at least one sensor, a recipe for manufacturing a semiconductor wafer;

tracking, with a fault detection system, a set of steps for the recipe;

determining, by the fault detection system, a start of a step;

sensing, by the at least one sensor, a set of data related to at least one parameter of the step;

generating, by an imaging system, an image of the set of data;

displaying, on a display, the image of the set of data;

calculating, by the fault detection system, a pixel area ratio from the image of the set of data;

determining if a fault exists in the wafer, by the fault detection system, based upon the pixel area ratio; and displaying, on the display, an indication of the fault at an end of the step.

2. The method of claim 1, wherein the sensing comprises a real-time sensing.

3. The method of claim 2, wherein the sensing is continuous.

4. The method of claim 3, wherein the pixel area ratio comprises a comparison of a pre-pixel area of the image to a post-pixel area of the image for a duration of the step.

5. The method of claim 1, wherein the step includes reactive ion etching.

6. The method of claim 1, wherein the determining if a fault exists in the wafer includes comparing the pixel area ratio to a set of historical pixel area ratio results.

7. The method of claim 6, wherein the historical pixel area ratio results are stored in a database.

8. The method of claim 7, further comprising:

adding the image, when no fault is detected, to the historical pixel area ratio results.

9. The method of claim 8, further comprising:

analyzing the historical pixel area ratio results to determine a step which contributes to a historical fault.

10. The method of claim 1, wherein the display comprises an ultra-high definition display.

11. The method of claim 10, wherein the display runs at 4K resolution.

12. The method of claim 11, wherein the display allows for zooming in on the image.

13. The method of claim 12, wherein the determining if a fault exists in the wafer includes calculating the pixel area ratio from a zoomed in image.

14. The method of claim 1, further comprising:

sensing for a plurality of parameters;

generating a base line for each of the parameters;

and compiling each base line into the image.

15. The method of claim 14, further comprising:

generating an image that includes data for a plurality of steps into a single image.

16. A system for detecting faults in a semiconductor wafer comprising a processor, wherein a set of instructions stored on a memory cause the processor to perform a method, the method comprising:

monitoring, with at least one sensor, a recipe for manufacturing a semiconductor wafer;

tracking, with a fault detection system, a set of steps for the recipe;

determining, by the fault detection system, a start of a step;

sensing, by the at least one sensor, a set of data related to at least one parameter of the step;

generating, by an imaging system, an image of the set of data;

displaying, on a display, the image of the set of data;

calculating, by the fault detection system, a pixel area ratio from the image of the set of data;

determining if a fault exists in the wafer, by the fault detection system, based upon the pixel area ratio; and displaying, on the display, an indication of the fault at an end of the step.

17. The system of claim 16, wherein the sensing comprises a real-time sensing.

18. The system of claim 17, wherein the sensing is continuous.

19. The system of claim 18, wherein the pixel area ratio comprises a comparison of a pre-pixel area of the image to a post-pixel area of the image for a duration of the step.

20. The system of claim 16, wherein the step includes reactive ion etching.

\* \* \* \* \*